United States Patent [19]

Polacek et al.

[11] Patent Number: 5,039,832
[45] Date of Patent: Aug. 13, 1991

[54] TOUCH BUTTON LIGHT RING SYSTEM

[75] Inventors: Richard R. Polacek, Simsbury; Steven B. Davis, New Hartford, both of Conn.; Jean Youla, Brooklyn N.Y.

[73] Assignee: Otis Elevator Company, Farmington, Conn.

[21] Appl. No.: 376,079

[22] Filed: Jul. 5, 1989

[51] Int. Cl.⁵ .............................................. H01H 9/16
[52] U.S. Cl. .................................... 200/317; 200/600; 362/95; 362/246; 362/800
[58] Field of Search ............... 361/280, 277, 278, 283; 200/600, 308–317, DIG. 47; 187/121, 130; 362/30, 95, 246, 800; 307/112, 116, 117, 119, 139; 340/330, 332, 815.13, 815.15; D13/158, 162, 171; D26/125; D10/108

[56] References Cited

U.S. PATENT DOCUMENTS

| | | | |
|---|---|---|---|
| 1,823,319 | 9/1931 | Dickinson | 200/314 |
| 4,163,883 | 8/1979 | Boulanger | 200/314 |
| 4,583,151 | 4/1986 | Nagel | 362/29 |
| 4,650,037 | 3/1987 | Husson et al. | 187/130 |
| 4,716,992 | 1/1988 | Kunii | 187/121 |
| 4,758,701 | 7/1988 | Nagel | 200/314 |
| 4,805,739 | 2/1989 | Lind et al. | 187/121 |

*Primary Examiner*—A. D. Pellinen
*Assistant Examiner*—David Osborn

[57] ABSTRACT

The present invention is directed to an illuminated touch button system having a light ring element, a button element located within and surrounded by the light ring element and an array of light emitting diodes. The light ring element comprises a series of individual chambers situated substantially over each light emitting diode in the array. In the preferred embodiment, each chamber includes a set of three light-receiving triangulated surfaces, these surfaces having a series of edges which act to diffuse the illumination of the light emitting diodes. The chambers, in combination with the edges, produce a relatively even, bright light distribution in the portion of the light ring element surrounding the button element.

6 Claims, 2 Drawing Sheets

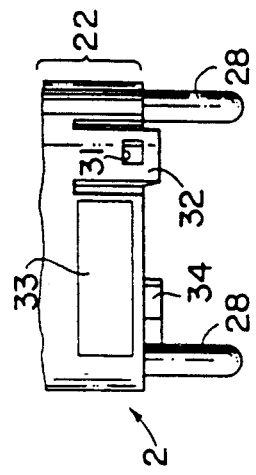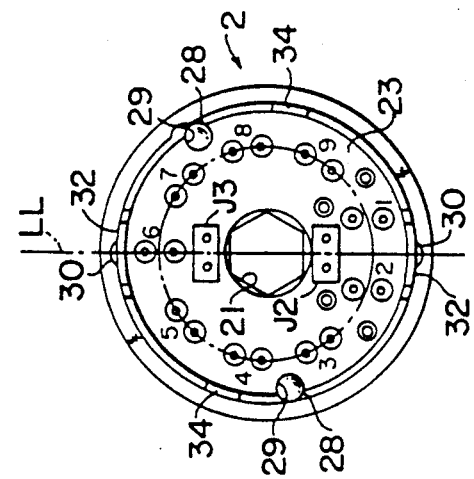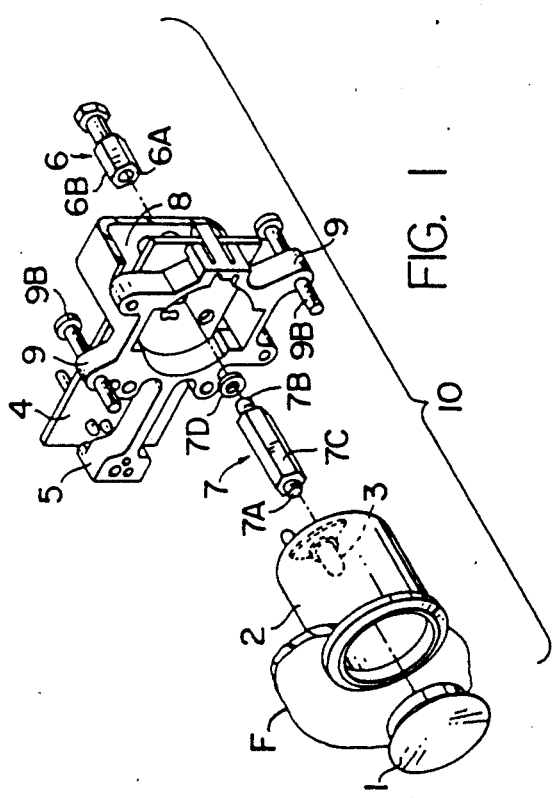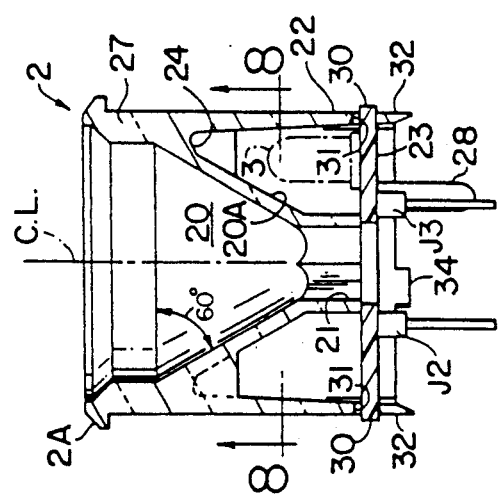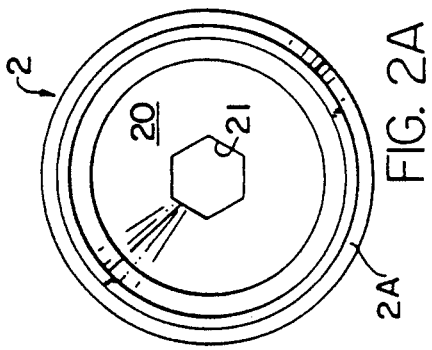

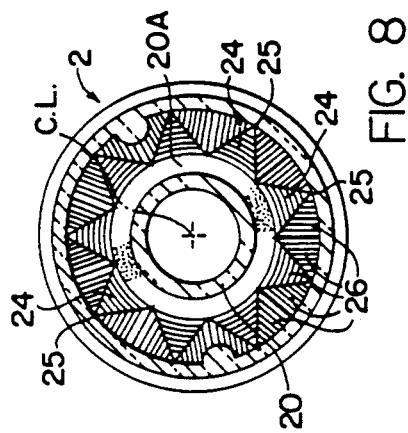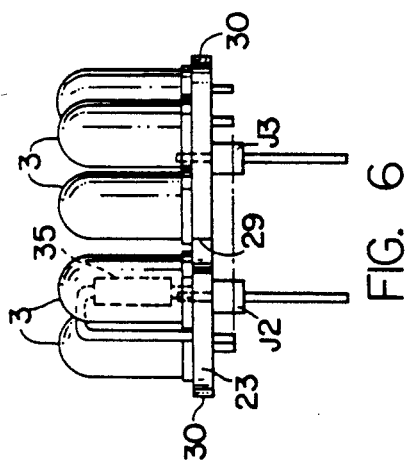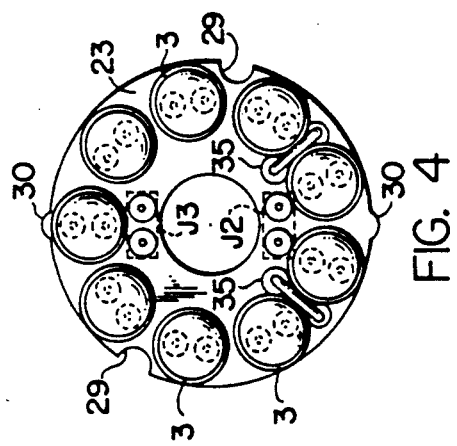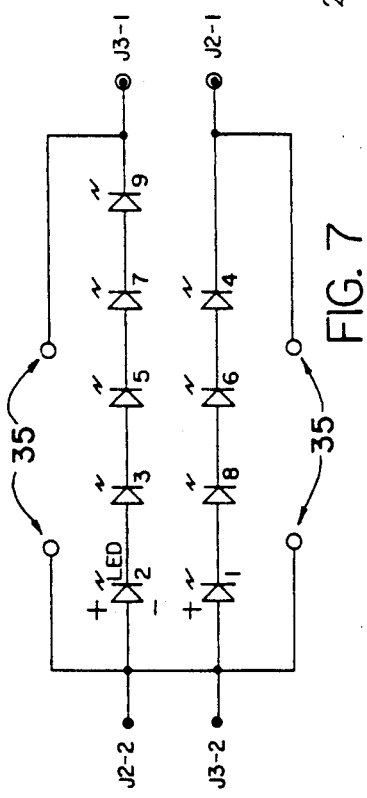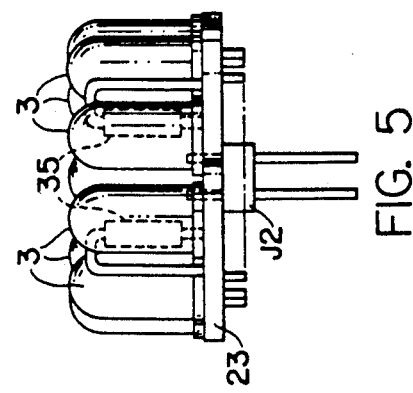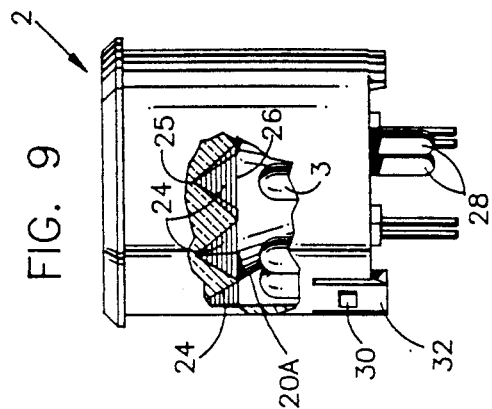

TOUCH BUTTON LIGHT RING SYSTEM

REFERENCE TO RELATED APPLICATION

This application relates to some of the same subject matter as the co-pending application entitled "Capacitive Sensing, Solid State Touch Button System" of Robert Bryan Leach, Chester J. Slabinski and Jean Youla filed June 30, 1989 as application Ser. No. 375,094, the disclosure of which is incorporated herein by reference.

1. Technical Field

The present invention relates to touch buttons typically used to activate or deactivate some electrical or electronic function, such as signaling, when touched typically by a human operator touching or "pushing" on the button with a finger. The invention more particularly relates to a light ring containing a circular array of light emitting diodes (LEDs) for a solid state touch button system operated, for example, by capacitive sensing, and even more particularly to such a button which can be used in many different applications, including particularly a touch or push button for elevator car calling or control, with the light ring providing visual feedback to the operator that the button has been actuated.

2. Background Art

In the elevator art is it common to provide "up" and "down" touch or push buttons at the entry areas to the elevators and to include similar buttons within the elevators for the passenger(s) to indicate at which floor(s) the elevator car should stop.

It is also common practice to include with such buttons an encircling light ring, which is illuminated when the button has been actuated as a visual feedback to the operator. Typically, such rings received light from incandescent bulbs.

Some elevator related, U.S. Patents which may be of interest are listed below:

| U.S. Pat. No. | Patentee(s) | Issue Date |
| --- | --- | --- |
| 4,650,037 | Husson et al | March 17, 1987 |
| 4,716,992 | Kunii | Jan. 5, 1988 |
| 4,805,739 | Lind et al | Feb. 21, 1989 |

The '739 Pat. (Lind et al) discloses an elevator control switch and position indicator assembly for mounting in a panel comprising a piezoelectric element and a control circuit connected to the element for generating an elevator control pulse in response to an output signal from the element. A circular push button assembly is arranged such that, when the push button is operated, a force is applied to the piezoelectric element, and the push button assembly is restrained so that it can only deflect the element a predetermined distance sufficient to produce an output signal. The assembly further comprises an integral indicator device for providing an indication to the operator that an elevator control signal has been generated. The device is indicated as being configurable to provide an indication of the position of an elevator car.

In the first embodiment (FIG. 1) of the Lind et al U.S. Pat., the light from a single, centrally located, long-life LED (44) with multiple elements for increased luminous intensity, in place of the short lived bulb of the prior art, is fed through a lens guide (16), forming a generally annular cross-section lens for guiding light to an externally disposed lens ring (42), to form a halo effect. The ring is illustrated as being integrally formed with the lens guide, which can be made of optical grade polycarbonate. Although the surfaces facing the LED are not described, they are illustrated as appearing primarily, if not completely, laterally extended, with the nature of the facing surface not being clearly illustrated, with two laterally extended, parallel lines appearing in the drawing (FIG. 1).

In a second embodiment (FIG. 6) of the Lind et al U.S. Pat. a separately actuated LED (74) without any light pipe is positioned above the other LED and its lens guide to separately illuminate a centrally located, translucent graphic disk (76) positioned directly over it (in place of the operator button) to serve as an elevator car position indicator.

There is no admission that the '739 Pat., which was filed on Jan. 14, 1988, is prior art to the present invention. However, assuming arguendo that it were, it does not teach, inter alia, an annular, circular array of a multiple number of LEDs using a series of alternating, inclined saw-toothed or grooved, triangulated surfaces above each LED surrounding a frosted, circular surface feeding the light rays from the multiple LEDs to the button surrounding light ring, producing a highly diffused, bright halo, with a relatively even luminosity, much less any of the many other innovative features of the present invention.

The '037 Pat. (Husson et al) discloses the use of separated, independent LEDs in a controller apparatus for detecting lamp failures in an elevator system, an application not at all analogous to a touch or push button with a surrounding light ring.

The '992 Pat. (Kunii) discloses the use of "light emitting means" (14) to illuminate indication marks on an elevator panel. Exactly what the "light emitting means" is, is not clear But again, regardless of the nature of the "light emitting means," there is no suggestion of, inter alia, an annular, circular array of a multiple number of LEDs using a series of alternating, inclined saw-toothed or grooved, triangulated surfaces above each LED surrounding a frosted, circular surface feeding the light rays from the multiple LEDs to the button surrounding light ring, producing a highly diffused, bright halo, with a relatively even luminosity, much less any of the many other innovative features of the present invention.

DISCLOSURE OF INVENTION

The light ring of the invention preferably includes an annular, transparent or translucent, light pipe section having an open center at its end which faces the exterior (such as, for example, the hall or car, as the case may be, when used in an elevator system), and a restricted, basal end, which is hidden in the wall behind the button touch surface. A plurality of LEDs are mounted inside the basal end of the light ring in an annular, circular array, and, preferably, an alternating series of saw-toothed or grooved annulus of light dispersing, internal, triangular interfaces or light receiving surfaces is disposed between the LEDs and the ring end of the rim.

In this way light is evenly piped to the open end of the ring, in which the button disc element is located, to form a bright, even halo around the button disc element to serve, for example, as a visual feedback to the button pusher that the button has been activated.

Various, other innovative features preferably are included to, inter alia, insure the proper alignment and keying of the sub-elements which make up the light ring, including a printed circuit board (PCB) base, which carries the LEDs and some of its associated circuitry, and the molded light transmitting body of the light ring.

The invention may be practiced in a wide variety of applications, including but certainly not restricted to elevator car call or control buttons, utilizing known technology, in the light of the teachings of the invention, which are discussed in detail hereafter.

Other features and advantages will be apparent from the specification and claims and from the accompanying drawings, which illustrate at least one exemplary embodiment of the invention.

BRIEF DESCRIPTION OF DRAWINGS

FIG. 1 is an exploded, perspective view of an exemplary solid state push button assembly, including the button, light ring, printed circuit (PC) board and holder for attaching the PC board to the push button elements and the overall button assembly to a face plate or panel, with the PC board carrying the electrical components which form the exemplary electronics and circuitry of the present invention. (It is noted that the touch button elements of FIG. 1 are basically symmetrical about their longitudinal center-line, except for the PC board and its associated holder.)

FIGS. 2A, 2B & 2C are top side/cross-sectional and bottom views, respectively, of the light ring element of the button assembly of FIG. 1.

FIG. 3 is a partial, side view showing the bottom portion of the light ring element of FIGS. 2A-2C.

FIG. 4 is a top view of the LED base element of the light ring element of FIGS. 2A-2C; while FIG. 5 is a side view thereof, and FIG. 6 is a further side view with the base rotated ninety (90°) from its position in FIG. 5.

FIG. 7 is a schematic diagram of the LED circuitry of the light ring element of FIGS. 2A-2C.

FIG. 8 is a cross-sectional view of the light ring element of FIGS. 2A-2C (taken along section line 8—8 of FIG. 2B) looking up into the triangularly topped cavities in the light ring element in which the LEDs are positioned, and which cause the light emanating from the LEDs to be disbursed up into and through the transparent material of the upper portion of the light ring element to be transmitted out of the surrounding ring portion of the element to be viewed by, for example, the button pusher.

FIG. 9 illustrates a side view of the light ring element of the present invention, with LEDs of FIG. 5 shown relative to the chambers of FIG. 8.

BEST MODE FOR CARRYING OUT THE INVENTION

As can be seen in FIG. 1, the exemplary "solid state button" (SSB) assembly 10 of the present invention preferably includes a non-moving, capacitive sensing button surface 1, that can be used, for example, as a call button in the car operating panel (COP) and/or hall fixtures of an elevator system. The SSB is capable of capacitively sensing a human touch, preferably providing both visual feed back (illumination) to the button pusher, as well as communication to the operational control of the elevator system via a remote station (RS; not illustrated) interface that the button has been actuated, so that the system accordingly can react.

The exemplary button system of FIG. 1 includes the non-moving button element 1 fitted within a light ring element 2, in which ring is carried a circular array of light emitting diodes (LEDs) 3 at its bottom, there being preferably at least five (5) LEDs, with nine being used in the illustrated, exemplary, currently preferred embodiment.

A printed circuit board 4, into which the light ring element 2 is pin inserted, is carried on the back side of the button elements 1, 2, and is held to the button elements by a bracket 5 and a rear bolt 6 having a bolt head 6B. As can be generally visualized in FIG. 1, the bolt head 6B extends past the bottoms of all of the other button elements of the button assembly 10.

An interconnecting bolt or stem 7 has a front, threaded, male end 7A, which is screwed into the back side of the button surface 1, and a rear, threaded, male end 7B, which is screwed into the front end 6A of the rear bolt 6 with a lock washer 7D. The interconnecting bolt 7 extends through a center, generally circular opening 20 (which can be seen in FIGS. 2A-2C and 4 & 8) in the light ring element 2 and through an opening in the PC board 4, while the head 6B of the rear bolt fits into a notch in a "U" shaped rear strap 8, which is part of the bracket holder 5. The bolt or stem 7 has a series of longitudinally extended, flat, side surfaces 7C, forming a hexagonal cross-section for the stem which mates with a like configured, interior surface 21, which forms the lower part of the central opening 2.

When assembled, the intermediate elements of the button assembly 10 are held in compression between the button surface 1 and the head 6B of the bolt 6. The flat surface interfacing of the stem 7 and the interior opening 21 fixes and keys them together about their common, longitudinal axis, thus preventing the light ring 2 from being rotatable or movable around the stem about their common, longitudinal axis.

The bracket 5 includes a series of peripherally spaced, lateral extensions or arms 9, through which threaded screw pins 9B are placed for fastening the button assembly 10 to a face plate or panel by means of like threaded female orifices in the face plate or panel. When so fastened, the only elements of the button assembly 10 which are seen by the user is the non-moving, circular button surface 1 surrounded by the translucent ring 2A, which is illuminated with relatively bright, relatively evenly diffused light originally emanating from the internally contained LEDs when the button is actuated. Alternatively, if so desired and depending on the application involved, the top ring portion 2A could be illuminated by its associated circuitry when the button is in its "off" condition.

The printed circuit board 4 carries on it the electronic components and associated circuitry which perform the monitoring functions of the button. Two exemplary embodiments (an auto-balancing embodiment and a constant pressure embodiment) of the circuitry are described in detail in the co-pending application referred to above application Ser. No. 375,094 and incorporated herein by reference.

LIGHT RING (2)

As will be detailed more fully below, the substantially cylindrical body of the light ring 2 includes a top ring portion 2A of light emitting material encircling the button surface element 1, an upper portion 27 of light transmitting material, and a bottom portion, which is (but need not be) of light transmitting material. The bottom portion includes a base 23 carrying an array of LEDs 3.

The illumination of the light ring 2 is controlled by the button surface through appropriate circuitry, as discussed in some detail in the co-pending application Ser. No. 375,094. The source of the illumination is comprised, for example, of two strings of LEDs 3 located at the bottom of the light ring 2 and are fed preferably by dedicated current regulators through pin connectors J2 and J3 (note FIGS. 2C & 7), which pin connectors are inserted into connector openings in the printed circuit board (PCB) 4. The current through each string of LEDs 3 is regulated to, for example, thirty (30 mA) milliamps, by appropriately controlling the voltage. Compensating resistors 35 can be included with the LEDs 3, if so desired.

As can be seen in FIGS. 4–7, an exemplary nine LEDs 3 are included, preferably equally spaced about the periphery of the bottom base area 22 of the light ring 2, forming an annular array.

As can be seen in FIG. 2, the connecting pins for the nine (1–9) LEDs 3 all fall on the periphery of a circle about the longitudinal center line (C.L.; note FIG. 2B) of the light ring 2, except for the initial, first (1) and second () LEDs in each string (note schematic of FIG. 7) and the sixth (6) one, which is oppositely positioned to the positions of the first and second ones. The two pin connections or leads for each of these three LEDs are preferably positioned in a line parallel to a lateral line LL bisecting the base 23.

The base 23, which is substantially circular in its lateral extent, is a printed circuit board (PCB), which includes printed, conductive lead lines interconnecting the LEDs 3 in two parallel strings, along with two associated, compensating resistors 35, if such is needed or desired, in accordance with the circuitry schematic of FIG. 7.

As can be seen in FIG. 8, each LED 3 "looks up" into the center of an triangulated chamber 24, with each individual chamber preferably being made up of three, inclined, triangular surfaces sharing a common apex 25, which is located at the outermost point of the central triangular surface and is at the outermost periphery of the inside of the light ring 2. Each of the three triangular surfaces of each chamber 24 includes a series of molded-in straight edges 26, each of which extends across its respective surface leading up to their common apex in a stepped fashion.

Each of these chambers 24 serves as the light receiving surfaces for its respective LED 3, channeling the light in a highly diffused manner into and through the light-pipe-like, solid interior of the upper portion 27 of the light ring 2 leading to the encircling, top, light ring portion 2A, through which the light from the light ring 2 is seen by the button user. The series of straight edges or steps function as Fresnel-like grooving the underside of the upper interior of the light ring 2. As shown with reference to FIG. 9, individual LEDs 3 are shown "looking up" into individual chambers 24 which comprise three triangulated surfaces joined at apex 25, each surface having straight edges 26.

The interior side 20A (note FIGS. 8 & 2B) of the surface 20 preferably is frosted, which frosted surface 20A, as can be seen in FIG. 8, is convex and terminates in the base side of the central one of the three triangulated surfaces forming the chambers 24. As can be further seen, one of the triangulated surfaces of each chamber 24 is positioned between the other two, sharing common sides with them, while the saw-toothed grooves or Fresnel-like edges 26 are disposed parallel to their respective bases of the triangulated surfaces.

As can best be seen in FIG. 2B, the upper, central, conical, circular area or centrally facing, exterior surface 20 is sloped at an angle of, for example, sixty (60°) degrees, that is, at an angle of thirty (30°) degrees to the center line C.L. This is done in order to provide diffusion reflection in the solid, light transmitting interior 27 and thus minimize the loss of any light from the solid interior of the ring 2 into the open, center area defined by the interior, center side of the conical surface 20, where the light effectively would be lost or wasted.

This overall arrangement produces a relatively uniform intensity of light at and about the outer, encircling ring 2A, although the light ultimately seen there originated in fact from the relatively discrete, spaced, light sources generated by the nine, peripherally spaced LEDs 3. The light ring 2, and in particular the upper, solid, light "pipe" portion 27, can be made of a single, integral, molded piece of transparent "LEXAN" (940 AR), with the exception of the PCB base 23 and its associated electrical components.

Although the illustrated (as described above and below) overall arrangement is currently preferred, it is of course subject to substantial variations, with many of the factors producing the desired light diffusion being interdependent, as known to those of ordinary skill in the optics art.

In order to properly align the molded body portion of the light ring 2 and the PCB base 23 with its LEDs 3), the molded body includes two, longitudinally extended, peripherally positioned but off-set, integrally molded pins or projections 28, which mate into circular indentations or cut-outs 29 similarly located in the periphery of the base, keying the two sub-elements together. The base 23 also includes two, opposed, radially directed projections 30, which fit into openings 31 (note FIG. 3) in flexible longitudinal extensions 32 in the molded body portion of the ring 2.

The pins 28 (and accordingly the indentations 29) preferably are offset, rather than being directly opposed, by being peripherally spaced from one another by an angle of, for example, one hundred and sixty (160°) degrees (vis-a-vis 180°). This insures that there is only one way or one mating alignment in which the base 23 can be positioned with respect to the ring body.

When the base 23 and the body of the ring 2 are properly aligned with the pins 28 in the indentations 29 and then brought together in a longitudinal direction, the extensions 32 flex out, allowing the radially directed projections to snap into the openings 31, latching the two sub-elements together. When it is desired to separate the two sub-elements, the extensions 32 are merely pulled laterally out, allowing the base 23 and its electrical components to be removed down and out away from the ring body.

When assembled, the pin connectors J2 & J3 are inserted into their respective mating openings in the PCB 4 to be connected into the circuit for the button assembly 10. Peripheral, longitudinally extended portions or bosses 34 are included to support the bottom of the ring on the PCB and prevent any rocking of the ring 2 about the bottom surfaces of the headers of the pin connectors J2 & J3.

If desired and as illustrated, two, vertically or longitudinally disposed resistors 35 could be included on and carried by the PCB base 23, along with their associated LEDs 3 (note FIGS. 5 & 6). These resistors 35 are connected into the circuitry of the base, as shown in the schematic of FIG. 7, by appropriately placed, printed circuit board lead lines on the base.

A rectangular "label" area 33 (note FIG. 3) can be provided on the lower side of the ring molded body to identify or serialize the ring 2, if so desired.

Approximate, exemplary dimensions for the light ring 2 are outlined below:

| Part | Dimension |
| --- | --- |
| Diameter of top ring portion 2A | 1" |
| Longitudinal length of body of light ring 2 | 1.1" |
| Longitudinal length of cylindrical, interior part of upper part 27 | 0.25" |
| Longitudinal length of inclined, conical part 20 | 0.5" |
| Longitudinal length of hex. area 21 | 1.5" |
| Lateral width of hex. area 21 | 0.25" |

EXEMPLARY ELEVATOR APPLICATIONS

The exemplary solid state button assembly 10 described in detail above is designed to be applied in a hall fixture and/or car operating panel (COP) of an elevator, although, of course, many other uses and applications are possible.

The hall fixture application allows for two button assemblies (not illustrated), a beeper or key switch assembly and an RS-4 type board to fit into a commercially available masonry box. The masonry box (not illustrated) used should provide a shallow wall depth for the entire assembly. A shallow wall depth [for example, sixty-five (65 mm) millimeters] avoids penetrating the hoist-way fire barrier in common commercial construction.

The face plates can be made of, for example, die cast metal and be available in various finishes. Also one, two or three (1, 2 or 3) position combinations of buttons or key switches can be used. A tamper proof fastener (not illustrated) preferably is used to fasten the face plate to the masonry box.

The COP application allows for multiple buttons to be mounted in a panel and connected to a Remote Serial Extender Board (not illustrated).

In hall fixture applications the face plate should be connected to the masonry box with, for example, an insulated flat braided conductor (not illustrated), having, for example, a maximum length of eighteen (18 cm.) centimeters. The masonry box should be bonded to building steel through wiring conduit or a flat braided conductor to the closest building steel.

A chassis ground is applied on the button from the face plate (hall fixture) or return panel (COP). In hall fixture applications the face plate should be grounded to the fixture electrical box, while the electrical box should be bonded to building steel through the wiring conduit.

The only product variations needed for the exemplary applications are the two colors of light rings, namely, red and green, and the application of the button to a hall fixture and a COP.

The exemplary unit described above is a relatively low cost, easily replaceable device, taking, for example, five (5) minutes to replace.

Although this invention has been shown and described with respect to at least one detailed, exemplary embodiment thereof, it should be understood by those skilled in the art that various changes in form, detail, methodology and/or approach may be made without departing from the spirit and scope of this invention.

Having thus described at least one exemplary embodiment of the invention, that which is new and desired to be secured by Letters Patent is claimed below.

We claim:

1. An illuminated touch button system for controlling an electrical function, said touch button system comprising:
   a light ring element having a top ring portion of light transmitting material, an upper portion having a solid interior of light transmitting material, and a bottom portion;
   a button element located within said light ring element and surrounded by said top ring portion;
   an array of peripherally-spaced light emitting diodes at least partially located within said bottom portion of said light ring element, said array being illuminated upon contact of said button element by a user, said upper portion transmitting the illumination from said array to said top ring portion, thereby providing visual feedback to the user;
   said upper portion of said light ring element having an interior surface comprising a plurality of chambers spaced about the periphery of said upper portion, wherein each light emitting diode is located below one of said chambers; and
   each of said chambers including an inclined surface having a series of Fresnel-like edges facing its respective light emitting diode for diffusing the illumination of said array.

2. An illuminated touch button system for controlling an electrical function, said touch button system comprising:
   a light ring element having a top ring portion of light transmitting material, an upper portion having a solid interior of light transmitting material, and a bottom portion;
   a button element located within said light ring element and surrounded by said top ring portion;
   an array of peripherally-spaced light emitting diodes at least partially located within said bottom portion of said light ring element, said array being illuminated upon contact of said button element by a user, said upper portion transmitting the illumination from said array to said top ring portion, thereby providing visual feedback to the user;
   said upper portion of said light ring element having an interior surface comprising a plurality of chambers spaced about the periphery of said upper portion, wherein each light emitting diode is located below one of said chambers; and
   each of said chambers including a set of at least two, light receiving, triangulated surfaces inclined down toward its respective light emitting diode.

3. The illuminated touch button system of claim 2, wherein each of said chambers includes:
   a set of three light-receiving, triangulated surfaces, each sharing a common apex located toward the outer exterior of said light ring element.

4. The illuminated touch button system of claim 3, wherein:
   each of said triangulated surfaces having a series of Fresnel-like edges facing toward its respective light emitting diode for diffusing the illumination of said array.

5. An illuminated touch button system for controlling an electrical function, said touch button system comprising:
   a light ring element having a top ring portion of light transmitting material, an upper portion having a solid interior of light transmitting material, and a bottom portion;
   a button element located within said light ring element and surrounded by said top ring portion;
   an array of peripherally-spaced light emitting diodes at least partially located within said bottom portion of said light ring element, said array being illuminated upon contact of said button element by a user, said upper portion transmitting the illumination from said array to said top ring portion, thereby providing visual feedback to the user; and
   said upper portion of said light ring element having an exterior, centrally-directed side having a centerline axis, said side having a conical surface which produces diffusion reflection for the illumination traveling within its solid, light transmitting material, said conical surface at least partially reducing the illumination from said light emitting diodes to the open interior of said upper portion.

6. The illuminated touch button system of claim 5, wherein said conical surface diverges toward said top ring portion at about a 30° angle, relative to the centerline axis.

* * * * *

UNITED STATES PATENT AND TRADEMARK OFFICE
CERTIFICATE OF CORRECTION

PATENT NO. : 5,039,832
DATED : August 13, 1991
INVENTOR(S) : Richard R. Polacek, et al.

It is certified that error appears in the above-identified patent and that said Letters Patent is hereby corrected as shown below:

In Column 3, line 54, insert in the center of the line --BUTTON ASSEMBLY (10)--.

In Column 4, line 27, delete "2" and insert --20-- in lieu thereof.

In Column 5, line 2 after the word surface insert --1--.

line 19, delete "2" and insert --2C-- in lieu thereof.

line 23, after the word second delete "()" and insert --(2)-- in lieu thereof.

In Column 6, line 30, after 3 delete ")".

Signed and Sealed this

Twelfth Day of January, 1993

Attest:

DOUGLAS B. COMER

*Attesting Officer*    Acting Commissioner of Patents and Trademarks